United States Patent [19]

Umeyama

[11] Patent Number: 5,266,826
[45] Date of Patent: Nov. 30, 1993

[54] SEMICONDUCTOR INTEGRATED CIRCUIT

[75] Inventor: Takehiko Umeyama, Itami, Japan

[73] Assignee: Mitsubishi Denki Kabushiki Kaisha, Tokyo, Japan

[21] Appl. No.: 878,511

[22] Filed: May 5, 1992

[30] Foreign Application Priority Data

Jul. 24, 1991 [JP] Japan .................................. 3-184564

[51] Int. Cl.⁵ ..................... H01L 27/22; H01L 27/02; H01L 27/10; H01L 23/48
[52] U.S. Cl. .................................. 257/368; 257/401; 257/421; 257/773; 257/786
[58] Field of Search ........................ 357/68, 41, 45, 27; 257/368, 401, 421, 773, 786

Primary Examiner—Mark V. Prenty
Attorney, Agent, or Firm—Oblon, Spivak, McClelland, Maier & Neustadt

[57] ABSTRACT

Write transistors $Q_{1W}, Q_{2W}, Q_{3W}, Q_{4W}$ are arranged in a line, and read transistors $Q_{1R}, Q_{2R}, Q_{3R}, Q_{4R}$ are also arranged in a line. Wiring pads P11, P12, P13, P14 are arranged between the write and read transistors in a line parallel to both of the lines. Heat generated by a write operation in the write transistors does not significantly influence the read transistors in a read operation. The influences are exerted on the read transistors approximately uniformly, so that an offset voltage difference can be minimized in differential amplification.

8 Claims, 5 Drawing Sheets

SEMICONDUCTOR INTEGRATED CIRCUIT

BACKGROUND OF THE INVENTION

1. Field of the Invention

The present invention relates to a semiconductor integrated circuit which includes a plurality of input/output circuits and more particularly to an improvement in an output DC offset of a read circuit in a magnetic read/write circuit.

2. Description of the Background Art

FIG. 4 shows an example of conventional magnetic read/write circuits. Both ends of a head 2 are connected to the collectors of write transistors $Q_{1W}$ and $Q_{2W}$ through terminals P1 and P2, respectively. Similarly, both ends of a head 3 are connected to the collectors of write transistors $Q_{3W}$ and $Q_{4W}$ through terminals P3 and P4, respectively. The center taps of the heads 2 and 3 are connected to a power source 1. The bases of read transistors $Q_{1R}$ and $Q_{2R}$ are connected to the collectors of the write transistors $Q_{1W}$ and $Q_{2W}$, respectively. Similarly, the bases of read transistors $Q_{3R}$ and $Q_{4R}$ are connected to the collectors of the write transistors $Q_{3W}$ and $Q_{4W}$, respectively. The emitters of the write transistors $Q_{1W}$ to $Q_{4W}$ are connected in common and are grounded through a write current source 8. The bases of the write transistors $Q_{1W}$ to $Q_{4W}$ are equipped with terminals 4 to 7, respectively.

The collectors of the read transistors $Q_{1R}$ and $Q_{3R}$ are connected in common to a power source 9 through a load circuit 10. Similarly, the collectors of the read transistors $Q_{2R}$ and $Q_{4R}$ are connected in common to the power source 9 through the load circuit 10.

The differential pair outputted from the load circuit 10 is inputted to an output amplifier 17 through lines 15 and 16. The differential pair outputted from the amplifier 17 is inputted to terminals 18 and 19.

The emitters of the read transistors $Q_{1R}$ and $Q_{2R}$ are connected in common to a read current source 13 through a switch 11. Similarly, the emitters of the read transistors $Q_{3R}$ and $Q_{4R}$ are connected in common to the read current source 13 through a switch 12.

A switch circuit 14 performs read/write switching. Outputs 20 and 21 of the switch circuit 14 are complementary signals. That is, the read current source 13 is on and the write current source 8 is off in a read operation. The read current source 13 is off and the write current source 8 is on in a write operation.

A block HDn operates when the head 2 is selected, and a block HD(n+1) operates when the head 3 is selected. The block HDn includes the write transistors $Q_{1W}$ and $Q_{2W}$, the read transistors $Q_{1R}$ and $Q_{2R}$ and the terminals P1 and P2. The block HD(n+1) similarly includes the write transistors $Q_{3W}$ and $Q_{4W}$, the read transistors $Q_{3R}$ and $Q_{4R}$ and the terminals P3 and P4.

There is shown in FIG. 2 an arrangement of the blocks HDn and HD(n+1) on the semiconductor integrated circuit. The terminals P1 to P4 are provided in the form of wiring pads P11 to P14 for connection to the heads on the semiconductor integrated circuit. Another arrangement is shown in FIG. 3, in which the read transistors and write transistors are transposed.

The operation of the magnetic read/write circuit of FIG. 4 will be discussed below. When the head 2 is selected for the write operation, the block HDn is selected. Specifically, the write transistors $Q_{1W}$ and $Q_{2W}$ are turned on by the current fed to the terminals 4 and 5, and the switch 11 is turned on. The read current source 13 is turned off and the write current source 8 is turned on by the switch circuit 14 with the output 20, 21 respectively. This permits a write current to flow in the write transistors $Q_{1W}$ and $Q_{2W}$, so that a magnetic field is generated in the head 2. The magnetic write operation is thus performed on a medium not shown.

Following is the operation of reading information which has been put on the medium. The read current source 13 is turned on and the write current source 8 is turned off by the switch circuit 14 with the output 20, 21 respectively. The signal which is read out of the head 2 is applied to the bases of the read transistors $Q_{1R}$ and $Q_{2R}$ to be differentially amplified. The amplified signals are sent to the load circuit 10, pass through the lines 15 and 16, and are outputted to the terminals 18 and 19 by the amplifier 17. The same is true for the operation in the block HD(n+1) when the head 3 is selected.

While the head 2 is selected, the block HD(n+1) which controls the head 3 does not operate for the reason described below. Since no current is fed to the terminals 6 and 7, the write transistors $Q_{3W}$ and $Q_{4W}$ do not operate even when the write current source 8 is on. Since the switch 12 is off, the read transistors $Q_{3R}$ and $Q_{4R}$ do not operate.

Hereinafter described is the read operation by selecting the head 3 after the write operation by means of the head 2 and the subsequent read operation. FIG. 5 shows the sequence of the aforesaid operation in the magnetic read/write circuit of FIG. 4. In a read/write switching operation W/G, the region W indicates a write time period, and the region R indicates a read time period. In a head switching operation HS, the regions Sn and S(n+1) indicate the selection of the blocks HDn and HD(n+1), respectively. An offset $V_{off}$ indicates the DC offset of the differential pair outputted from the terminals 18 and 19.

Until time $t_1$, the head 2, i.e., the block HDn is selected, and the write operation is performed. When the operation is switched from write to read at time $t_1$, a slight offset voltage difference $V_1$ is generated. The offset voltage difference $V_1$ results from an asymmetry layout of the read transistors $Q_{1R}$ and $Q_{2R}$, and can be normally minimized.

When the head 3, i.e., the block HD(n+1) is selected at time $t_2$ with the read operation continued, an offset voltage difference $V_2$ is generated. The offset voltage difference $V_2$ results from an asymmetry operation of the read transistors $Q_{3R}$ and $Q_{4R}$ affected by heat generated in the write transistors $Q_{1W}$ and $Q_{2W}$ which have been in operation before time $t_1$. The offset voltage difference $V_2$ is larger than the offset voltage difference $V_1$.

Since the output signal of the amplifier 17 is normally inputted to the next circuit by capacitance coupling, the offset voltage differences $V_1$ and $V_2$ are preferably small. For this purpose, it is preferable that the heat generated in the write transistors $Q_{1W}$ and $Q_{2W}$ has no effect or uniform effects on the read transistors $Q_{1R}$ to $Q_{4R}$.

In the conventional blocks HDn and HD(n+1), however, the transistors and wiring pads are disposed adjacent to each other as shown in FIGS. 2 and 3. The read transistors $Q_{1R}$ to $Q_{4R}$ are very susceptible to the heat generated in the write transistors $Q_{1W}$ and $Q_{2W}$.

With reference to FIGS. 2 and 3, the read transistors $Q_{1R}$ and $Q_{2R}$ are arranged in symmetrical relation to the write transistors $Q_{1W}$ and $Q_{2W}$. Accordingly, the read transistors $Q_{1R}$ and $Q_{2R}$ are affected symmetrically by the heat generated in the write transistors $Q_{1W}$ and $Q_{2W}$, so that the offset voltage difference $V_1$ can be minimized.

On the other hand, it is difficult to arrange the read transistors $Q_{3R}$ and $Q_{4R}$, which are included in the other block, in symmetrical relation to the write transistors $Q_{1W}$ and $Q_{2W}$. For reduction of the offset voltage difference $V_2$, it is necessary to space the read transistors $Q_{3R}$ and $Q_{4R}$ apart from the write transistors $Q_{1W}$ and $Q_{2W}$. It is, however, not preferable to increase the area of the blocks HDn and HD(n+1) from the viewpoint of integration. In other words, it is difficult to minimize the offset voltage difference $V_2$ relative to the predetermined area of the blocks.

In the conventional semiconductor integrated circuit including the magnetic read/write circuit, since the heat generated in the write transistors has unbalanced influences on the read transistors, there has been a problem that a large offset voltage difference is generated before and after the head switching operation when the heads are switched to perform the read operation immediately after the write operation.

SUMMARY OF THE INVENTION

According to the present invention, a semiconductor integrated circuit comprises a plurality of input/output circuits disposed adjacent to each other, each of the plurality of input/output circuits including a pair of input transistors for performing differential amplification, one or more wiring pads, and one or more output transistors disposed in opposite relation to the pair of input transistors across the one or more wiring pads.

Preferably, the output transistors are magnetic write transistors, and the input transistors are magnetic read transistors.

Since the input transistors and the output transistors are arranged across the wiring pads, the input transistors are not significantly affected by heat generated in the output transistors. Since the output transistors included in one input/output circuit are spaced apart from the input transistors included in another input/output circuit adjacent to the one input/output circuit, the heat generated in the output transistors has well-balanced effects on the read transistors in plurality.

As described above, the wiring pads are arranged between the output transistors and the input transistors to increase the distance therebetween. This provides a semiconductor integrated circuit capable of reducing an offset voltage difference generated before and after a head switching operation without increase in the area of the input/output circuits.

An object of the present invention is to provide a semiconductor integrated circuit capable of reducing an offset voltage difference generated before and after a head switching operation.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
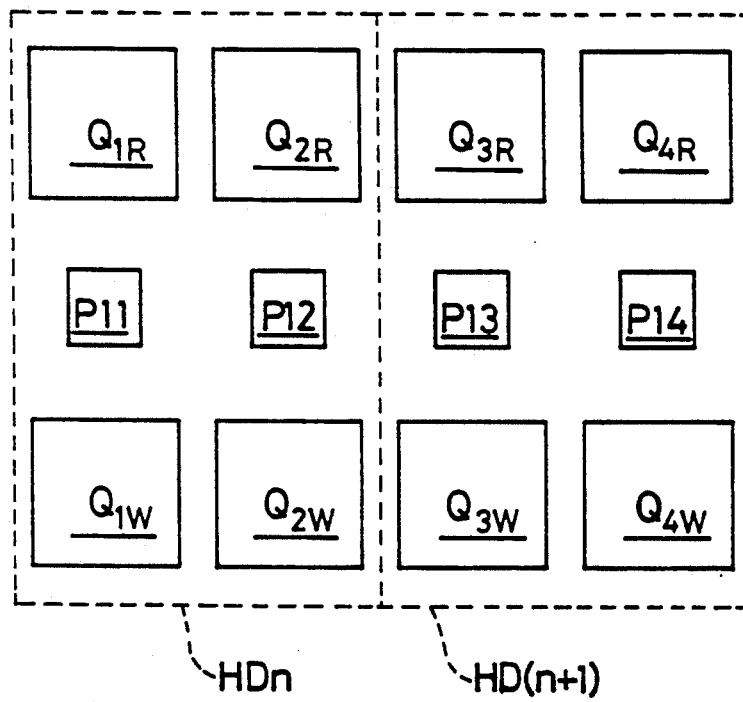
FIG. 1 is an arrangement diagram of a preferred embodiment according to the present invention.

FIG. 1 illustrates a schematic structure of a semiconductor integrated circuit 100 of a preferred embodiment according to the present invention. In a block HDn, read transistors $Q_{1R}$ and $Q_{2R}$ are disposed opposite to write transistors $Q_{1W}$ and $Q_{2W}$ across wiring pads P11 and P12, respectively. Similarly in a block HD(n+1), read transistors $Q_{3R}$ and $Q_{4R}$ are disposed opposite to write transistors $Q_{3W}$ and $Q_{4W}$ across wiring pads P13 and P14, respectively. The blocks HDn and HD(n+1) are disposed adjacent to each other.

Figure 2:
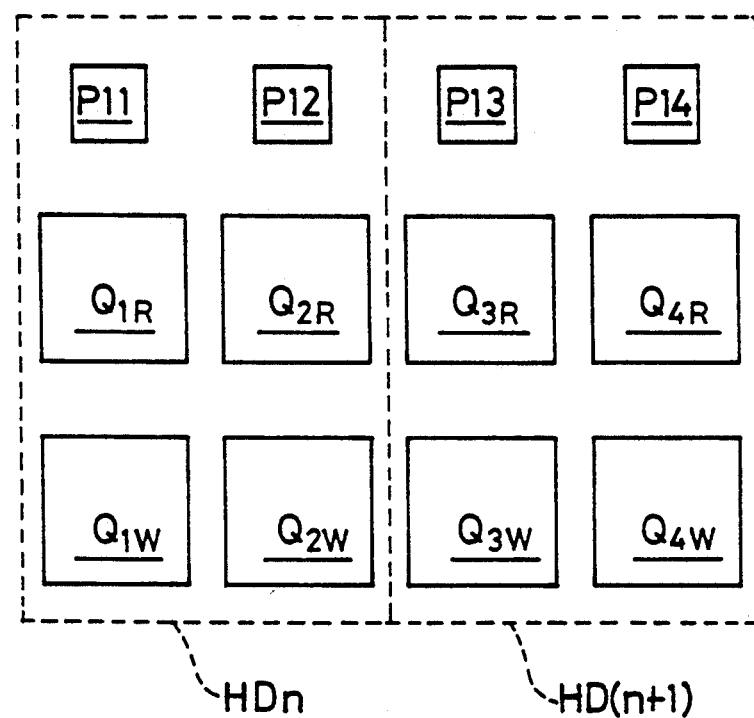
FIGS. 2 and 3 are arrangement diagrams of the prior art.
Figure 3:
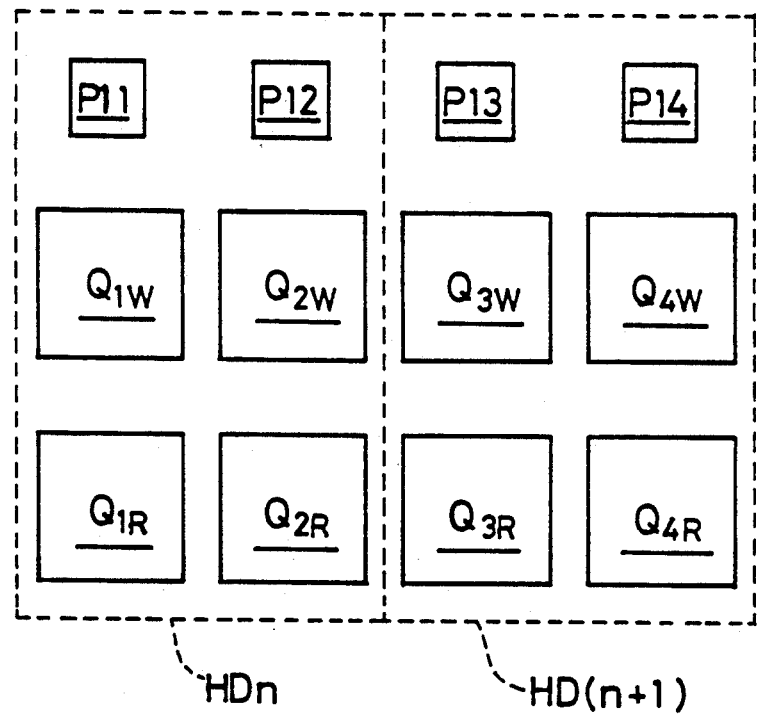
Figure 4:
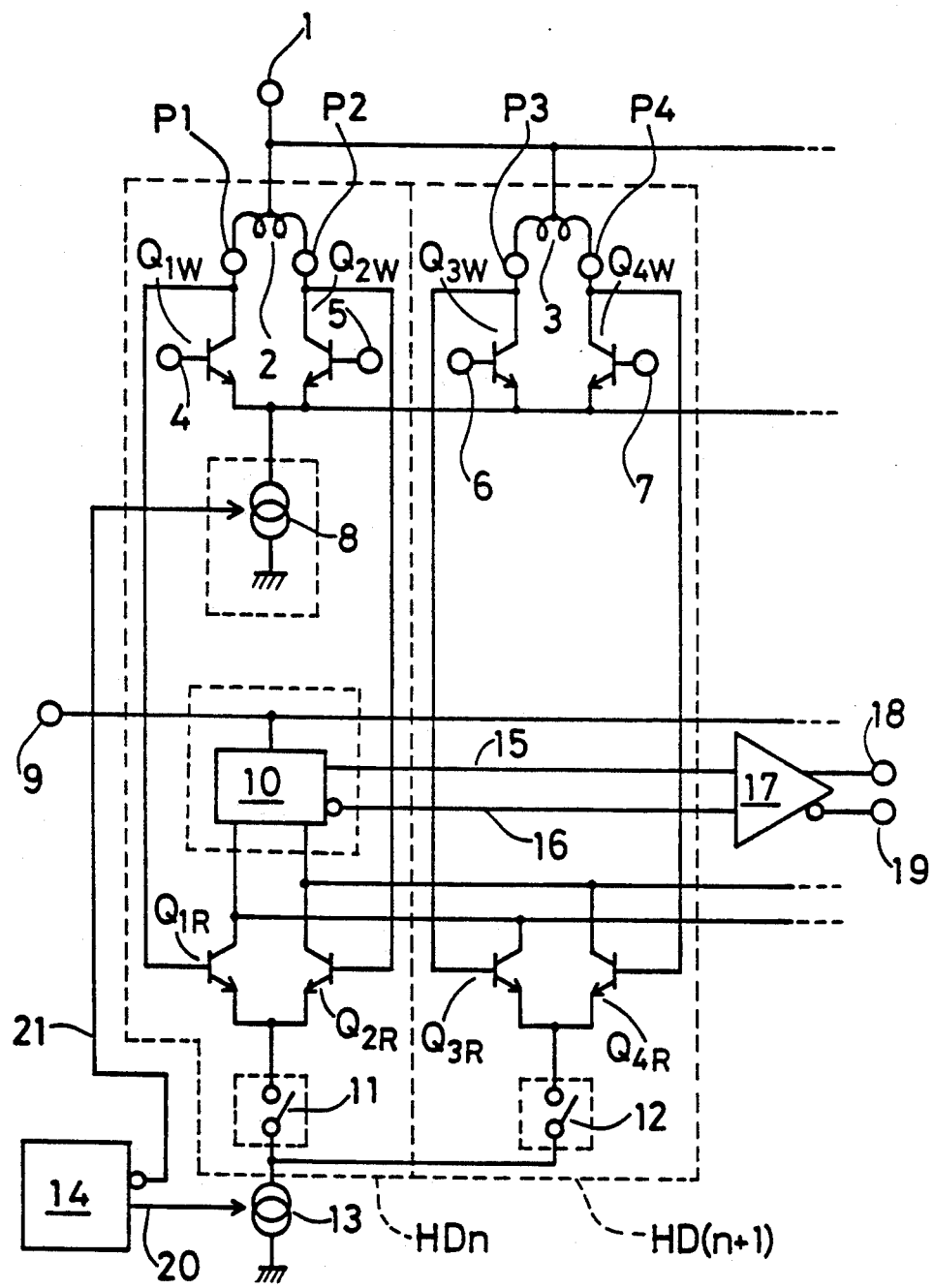
FIG. 4 is a circuit diagram of a magnetic read/write circuit.
Figure 5:
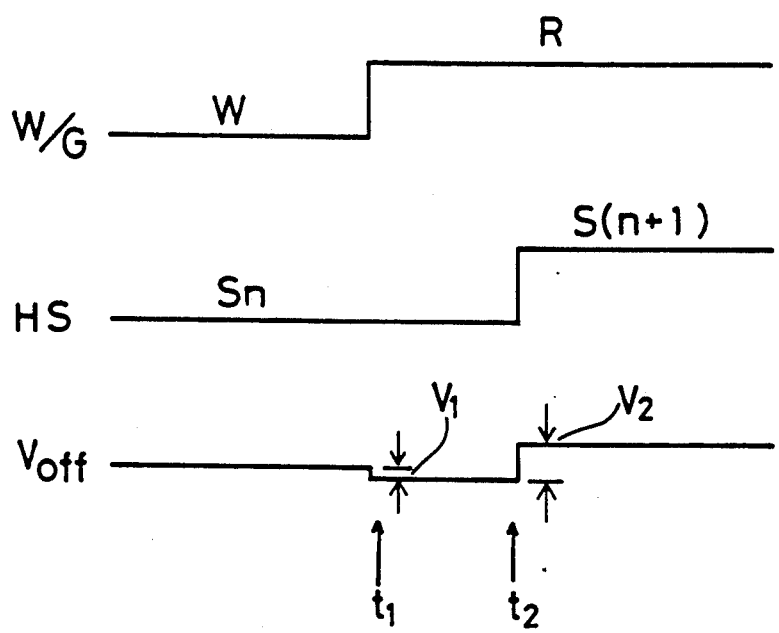
FIG. 5 is a graph showing the operation sequence of the circuit of FIG. 4.

In the semiconductor integrated circuit 100 having such arrangements, heat generated in the write transistors $Q_{1W}$ and $Q_{2W}$ affects the read transistors $Q_{1R}$ to $Q_{4R}$, similarly to the prior art, when a read/write operation based on the operation sequence of FIG. 5 is performed. However, there are relatively long distances between the write transistors $Q_{1W}$ and $Q_{2W}$ and the read transistors $Q_{1R}$ to $Q_{4R}$ compared with the arrangements of FIGS. 2 and 3. The influence of the heat is accordingly reduced. The symmetrical arrangement of the read transistors $Q_{1R}$ and $Q_{2R}$ relative to the write transistors $Q_{1W}$ and $Q_{2W}$ is not destroyed. The area of the blocks HDn and HD (n+1) is not increased compared with the areas in FIGS. 2 and 3.

Considering the write transistors $Q_{1W}$ and $Q_{2W}$ as a single heat source, the ratio of the distance between the heat source and the read transistor $Q_{3R}$ to the distance between the heat source and the read transistor $Q_{4R}$ is approximate to 1, so that the influences of heat on the read transistors $Q_{3R}$ and $Q_{4R}$ are approximately equal. Thus, the offset voltage difference $V_2$ can be minimized when the head is switched in the read operation and the read transistors $Q_{3R}$ and $Q_{4R}$ are differentially amplified.

The same is true for the semiconductor integrated circuit including an increased number of heads. As the distance increases between the block which controls the head selected in the read operation and the block which controls the head in the write operation immediately therebefore, the influences of heat generated in the write transistors on the read transistors which perform differential amplification are reduced and well-balanced.

While the invention has been shown and described in detail, the foregoing description is in all aspects illustrative and not restrictive. It is therefore understood that numerous modifications and variations can be devised without departing from the scope of the invention.

We claim:

1. A semiconductor integrated circuit comprising a plurality of input/output circuits disposed adjacent to each other, each of said plurality of input/output circuits including a pair of input transistors for performing differential amplification, one or more wiring pads, and one or more output transistors disposed in opposite relation to said pair of input transistors across said one or more wiring pads.

2. A semiconductor integrated circuit in accordance with claim 1, wherein said output transistors in operation have a relatively large heating value, and said pair of input transistors in operation have a relatively small heating value.

3. A semiconductor integrated circuit in accordance with claim 2, wherein
said output transistors are magnetic write transistors, and
said pair of input transistors are magnetic read transistors.

4. A semiconductor integrated circuit in accordance with claim 3, wherein said one or more output transistors are in plurality.

5. A semiconductor integrated circuit in accordance with claim 4, wherein said one or more output transistors are in pairs.

6. A semiconductor integrated circuit in accordance with claim 4, wherein said one or more wiring pads are equal in number to said plurality of output transistors.

7. A semiconductor integrated circuit in accordance with claim 6, wherein
said output transistors in plurality are arranged in a first row,
said wiring pads in plurality are arranged in a second row parallel to said first row, and
said pair of input transistors are arranged in a third row parallel to said first and second rows.

8. A semiconductor integrated circuit in accordance with claim 7, wherein
said plurality of input/output circuits include first and second input/output circuits,
said output transistors in said first and second input/output circuits are arranged in said first row,
said wiring pads in said first and second input/output circuits are arranged in said second row, and
said pair of input transistors in said first and second input/output circuits are arranged in said third row.

* * * * *